United States Patent
Chang et al.

(10) Patent No.: US 8,445,932 B1
(45) Date of Patent: May 21, 2013

(54) LIGHT-EMITTING DIODE DEVICE

(75) Inventors: Chia-Yin Chang, Kaohsiung (TW);
Ching-Chi Chiu, Kaohsiung (TW)

(73) Assignee: Radiant Opto-Electronics Corporation, Kaohsiung (TW)

( * ) Notice: Subject to any disclaimer, the term of this patent is extended or adjusted under 35 U.S.C. 154(b) by 0 days.

(21) Appl. No.: 13/412,639

(22) Filed: Mar. 6, 2012

(30) Foreign Application Priority Data

Dec. 30, 2011 (TW) .............................. 100149974 A

(51) Int. Cl.
*H01L 33/44* (2010.01)
(52) U.S. Cl.
USPC .......................... 257/98; 257/E33.058; 438/27
(58) Field of Classification Search
USPC ............ 257/98, 99, E33.058, E33.06; 438/27
See application file for complete search history.

(56) References Cited

U.S. PATENT DOCUMENTS

| | | | | |
|---|---|---|---|---|
| 7,952,105 | B2* | 5/2011 | Cok ................................. | 257/79 |
| 8,035,122 | B2* | 10/2011 | Kim et al. ....................... | 257/98 |
| 8,164,244 | B2* | 4/2012 | Furukawa ....................... | 313/483 |
| 2002/0061418 | A1* | 5/2002 | Imanishi ........................ | 428/690 |
| 2006/0099449 | A1* | 5/2006 | Amano et al. ................. | 428/690 |
| 2007/0012940 | A1* | 1/2007 | Suh et al. ........................ | 257/99 |
| 2009/0153972 | A1* | 6/2009 | Nakamura et al. ............. | 359/599 |

FOREIGN PATENT DOCUMENTS

| | | |
|---|---|---|
| KR | 10-2010-0004889 A | 1/2010 |
| KR | 10-2011-0025598 A | 3/2011 |

\* cited by examiner

*Primary Examiner* — Steven J Fulk
(74) *Attorney, Agent, or Firm* — CKC & Partners Co., Ltd.

(57) ABSTRACT

A light-emitting diode device is described, which includes a luminous body and a colloid. The luminous body has a light-emitting surface and a bottom surface on opposite sides. The luminous body has a first length, a first width and a beam angle. The colloid covers the luminous body. The colloid includes a first surface and a second surface on opposite sides. The second surface has a second length and a second width. The colloid has a refractive index. A distance between the light-emitting surface of the luminous body and the second surface of the colloid is smaller than a first value and greater than a second value. The first value $$< \frac{\text{the second width} - \text{the first width}}{2} \cdot \cot \alpha.$$

The second value $$< \frac{\text{the second width} - \text{the first width}}{2} \cdot \cot \nu.$$

The sin α=1/the refractive index of the colloid, and the ν is a full width at half maximum of the beam angle.

10 Claims, 3 Drawing Sheets

LIGHT-EMITTING DIODE DEVICE

RELATED APPLICATIONS

This application claims priority to Taiwan Application Serial Number 100149974, filed Dec. 30, 2011, which is herein incorporated by reference.

FIELD OF THE INVENTION

The present invention relates to a light-emitting device, and more particularly to a light-emitting diode (LED) device.

BACKGROUND OF THE INVENTION

Refer to FIG. 1. FIG. 1 illustrates a cross-sectional view of a conventional light-emitting diode device. The light-emitting diode device 100 mainly includes a luminous body 102, a colloid 104 and a plastic case 106. The luminous body 102 is disposed on a bottom surface 110 of a hole 108 of the plastic case 106, and is typically disposed on a central region of the bottom surface 110. The colloid 104 fills up the hole 108 and encapsulates the whole luminous body 102.

In the light-emitting diode device 100, the plastic case 106 is usually made of polycarbonate (PC). A color of the plastic case 106 is white for reflecting light 112 emitted by the luminous body 102 toward an inner surface 116 of the hole 108 of the plastic case 106, such that the lateral light 112 emitted by the luminous body 102 can be extracted from a light-emitting surface 114 of the light-emitting diode device 100.

However, when the light 112 of the luminous body 102 is emitted onto the inner surface 116 of the hole 108 of the plastic case 106, the energy of the light 112 is decayed. Therefore, after being reflected by the plastic case 106, the brightness of the light 112 is decreased. Furthermore, with such a design, a light field of the light-emitting diode device 100 is limited by an opening design of the plastic case 106.

SUMMARY OF THE INVENTION

Therefore, one aspect of the present invention is to provide a light-emitting diode device, in which a distance from a light-emitting surface of a luminous body to a light-emitting surface of a light-emitting diode device and a width of the luminous body are designed to make light emitted by the luminous body be directly extracted from an opening of the colloid without colliding with a sidewall of the colloid. Therefore, the light utilization efficiency of the luminous body is enhanced.

Another aspect of the present invention is to provide a light-emitting diode device, in which a distance from a light-emitting surface of a luminous body to a light-emitting surface of a light-emitting diode device and a length of the luminous body are designed to make light transversely emitted from the luminous body be extracted after being refracted by a sidewall of a colloid. Therefore, the beam angle of the light-emitting diode device in a length direction is increased.

Still another aspect of the present invention is to provide a light-emitting diode device, in which no polycarbonate plastic case is needed to cover a colloid, so that the process is simplified, the material cost is decreased, and the yellowing of the light-emitting diode device is effectively prevented.

According to the aforementioned aspects, the present invention provides a light-emitting diode device. The light-emitting diode device includes a luminous body and a colloid. The luminous body has a light-emitting surface and a bottom surface on opposite sides. The luminous body has a first length, a first width and a beam angle. The colloid covers the luminous body. The colloid includes a first surface and a second surface on opposite sides, the second surface has a second length and a second width, and the colloid has a refractive index. A distance from the light-emitting surface of the luminous body to the second surface of the colloid is smaller than a first value and greater than a second value, wherein:

$$\text{the first value} < \frac{\text{the second width} - \text{the first width}}{2} \cdot \cot \alpha,$$

$$\text{the second value} < \frac{\text{the second width} - \text{the first width}}{2} \cdot \cot v.$$

and the sin α=1/the refractive index of the colloid, and the v is a full width at half maximum of the beam angle.

According to one embodiment of the present invention, a material of the colloid is polymethylmethacrylate (PMMA).

According to another embodiment of the present invention, the refractive index of the colloid ranges from 1.2 to 1.6.

According to still another embodiment of the present invention, the beam angle ranges from 90 degrees to 160 degrees.

According to further another embodiment of the present invention, the distance from the light-emitting surface of the luminous body to the second surface of the colloid is greater than a third value, and the third value is greater than a fourth value, wherein:

$$\text{the third } Z3 > \frac{\text{the second length} - \text{the first length}}{2} \cdot \cot \alpha, \text{ and}$$

$$\text{the fourth } Z4 > \frac{\text{the second length} - \text{the first length}}{2} \cdot \cot v.$$

According to yet another embodiment of the present invention, the luminous body includes a light-emitting diode chip and a colloid layer. The colloid layer covers the light-emitting diode chip. In one example, the colloid layer includes a fluorescent colloid.

According to still further another embodiment of the present invention, the first surface and the second surface are uniform in area and shape, the first surface is directly opposite to the second surface, and the bottom surface of the luminous body or an orthographic projection of the bottom surface relative to the first surface is located right in a center of the first surface.

According to still yet another embodiment of the present invention, an orthographic projection of the luminous body relative to the second surface is located right in a center of the second surface.

According to still yet another embodiment of the present invention, the colloid has a side surface connected between the first surface and the second surface, and an included angle between the side surface and the first surface ranges from 30 degrees to 150 degrees.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1:
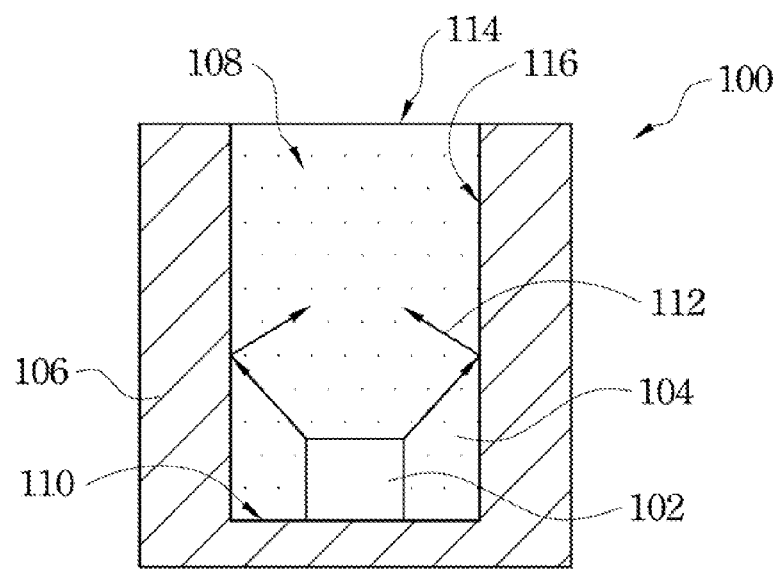
FIG. 1 illustrates a cross-sectional view of a conventional light-emitting diode device.
Figure 2:
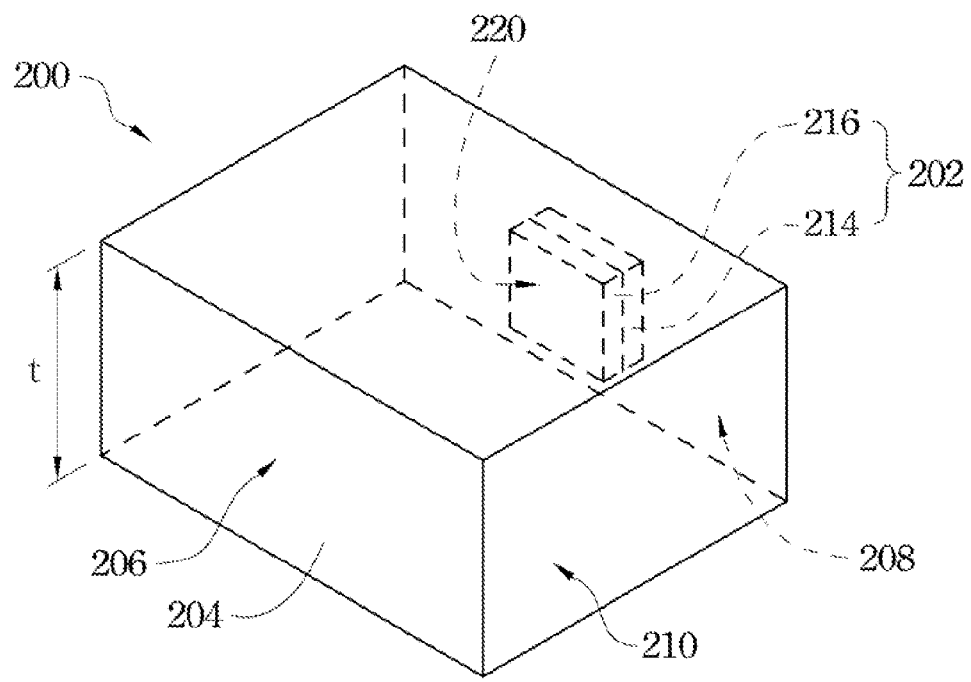
FIG. 2 is a three-dimensional drawing of a light-emitting diode device in accordance with an embodiment of the present invention.
Figure 3:
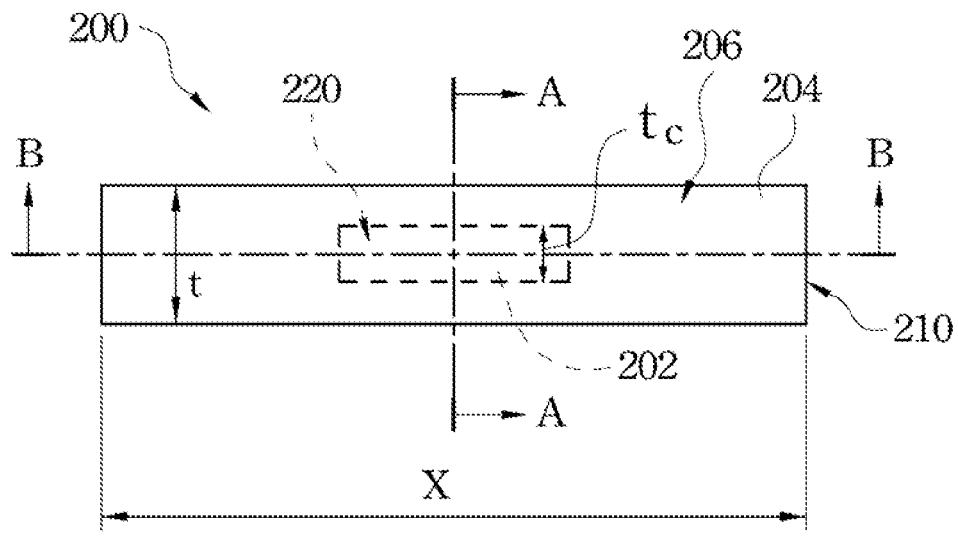
FIG. 3 illustrates a front view of a light-emitting diode device in accordance with an embodiment of the present invention.

Refer to FIG. 2 and FIG. 3. FIG. 2 and FIG. 3 respectively illustrate a three-dimensional drawing and a front view of a light-emitting diode device in accordance with an embodiment of the present invention. In one embodiment, a light-emitting diode device 200 mainly includes a luminous body 202 and a colloid 204. However, the light-emitting diode device 200 does not include a white plastic case, which is contained in a conventional light-emitting diode device.

In an exemplary embodiment, the luminous body 202 mainly includes a light-emitting diode chip 214 and a colloid layer 216. The colloid layer 216 covers the light-emitting diode chip 214. The colloid layer 216 may be a transparent colloid, so that light 218 (referring to FIG. 4) emitted by the light-emitting diode chip 214 can be extracted from the luminous body 202. In one example, according to the color required by the light-emitting diode device 200, the colloid layer 216 may be a fluorescent colloid, which is doped with fluorescent powders with the desired color, for example.

Figure 4:
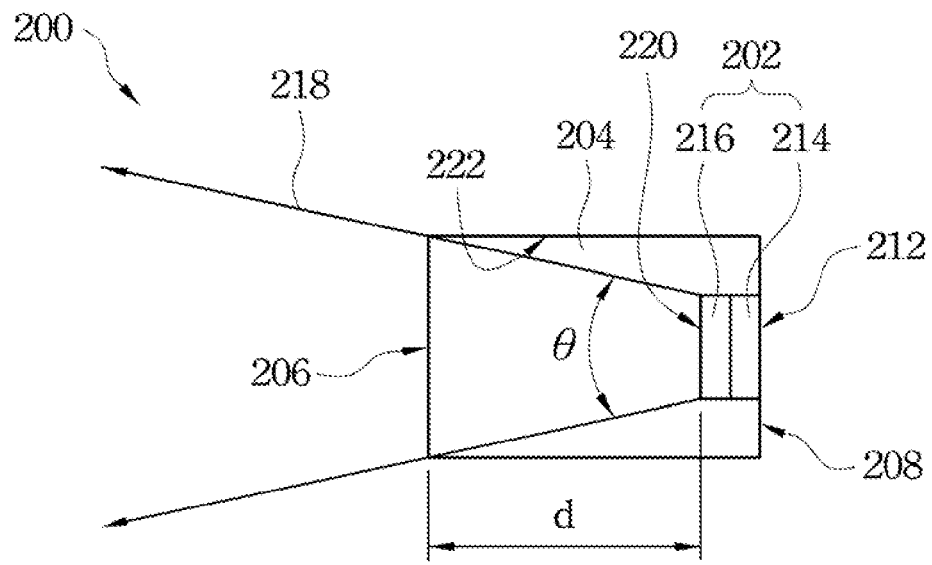
FIG. 4 illustrates a cross-sectional view of the light-emitting diode device taken along a cross-sectional line A-A of FIG. 3.
Figure 5:
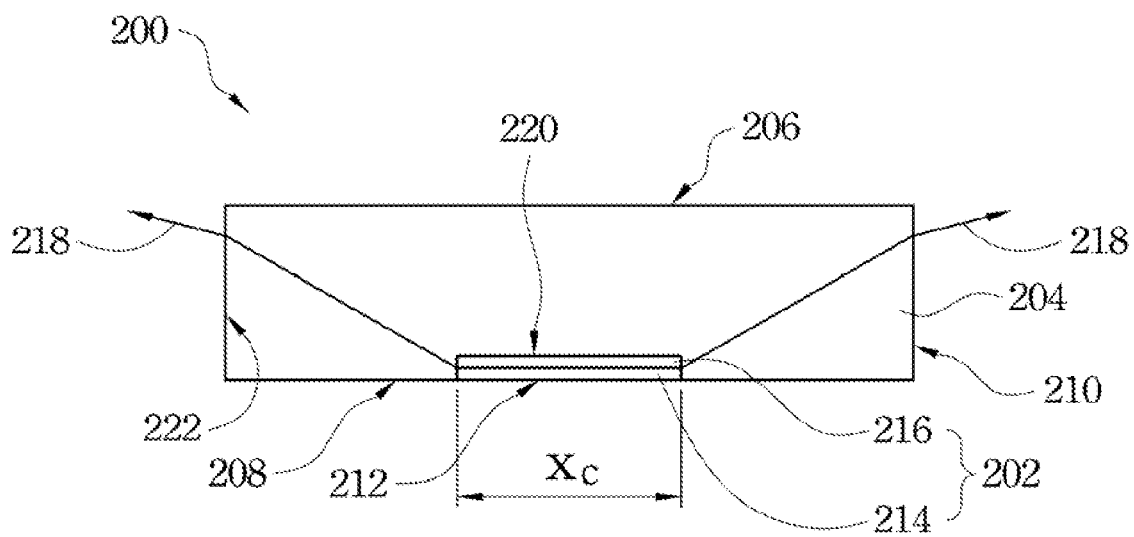
FIG. 5 illustrates a cross-sectional view of the light-emitting diode device taken along a cross-sectional line B-B of FIG. 3.

Simultaneously refer to FIG. 4 and FIG. 5. FIG. 4 and FIG. 5 respectively illustrates cross-sectional views of the light-emitting diode device taken along cross-sectional lines A-A and B-B of FIG. 3. The luminous body 202 has a light-emitting surface 220 and a bottom surface 212. The light-emitting surface 220 and the bottom surface 212 are respectively on opposite sides of the luminous body 202. As shown in FIG. 4 and FIG. 5, the light-emitting surface 220 of the luminous body 202 is a top surface of the colloid layer 216, and the bottom surface 212 of the luminous body 202 is a bottom surface of the light-emitting diode chip 214. The luminous body 202 has a length and a width $t_c$. As shown in FIG. 4, the luminous body 202 has a beam angle θ. In an embodiment, the beam angle θ of the luminous body 202 may range from 90 degrees to 160 degrees.

The colloid 204 encapsulates the luminous body 202. Referring to FIG. 4 and FIG. 5 again, the colloid 204 has surfaces 206 and 208 respectively on two opposite sides of the colloid 204. The surface 206 of the colloid 204 is a light-emitting surface of the light-emitting diode device 200. In addition, the colloid 204 further includes a side surface 210. The side surface 210 of the colloid 204 is connected between the opposite surfaces 206 and 208.

In the present embodiment, the luminous body 202 is embedded in the surface 208 of the colloid 204. In one exemplary embodiment, the bottom surface 212 of the luminous body 202 and the surface 208 of the colloid 204 are coplanar, such as shown in FIG. 4 and FIG. 5. In another exemplary embodiment, the bottom surface 212 of the luminous body 202 may protrude out of the surface 208 of the colloid 204. In still another exemplary embodiment, the whole bottom surface 212 of the luminous body 202 may be buried in the colloid 204. The colloid 204 may be made of a transparent material, and a material of the colloid 204 may be polymethylmethacrylate (PMMA), for example. Based on the use of the different materials, the colloid 204 may be of different refractive indexes. In one exemplary embodiment, the refractive index of the colloid 204 may range from 1.2 to 1.6.

As shown in FIG. 3, the surface 206 of the colloid 204 has a length X and a width t. Refer to FIG. 2 and FIG. 5 again. In the present embodiment, the surfaces 206 and 208 of the colloid 204 are uniform in area and shape, and the surface 208 is directly opposite to the surface 206. In one exemplary embodiment, the bottom surface 212 of the luminous body 202 or an orthographic projection of the bottom surface 212 relative to the surface 208 of the colloid 204 may be located right in the center of the surface 208 of the colloid 204. Therefore, distances from the luminous body 202 to any two opposite sides of the surface 206 of the colloid 204 are equal to each other. In one exemplary example, as shown in FIG. 2 through FIG. 5, the surfaces 206 and 208 of the colloid 204 are rectangular, and the side surface 210 are perpendicular to the surfaces 206 and 208 both.

In the light-emitting diode device 200 of the present embodiment, a distance d from the light-emitting surface 220 of the luminous body 202 to the light-emitting surface of the light-emitting diode device 200, i.e. the surface 206 of the colloid 204, has to be smaller than a first value Z1 and greater than a second value Z2, i.e. Z2<the distance d<Z1, wherein:

$$\text{the first value } Z1 < \frac{\text{the width } t - \text{the width } t_c}{2} \cdot \cot \alpha, \text{ and}$$

$$\text{the second value } Z2 < \frac{\text{the width } t - \text{the width } t_c}{2} \cdot \cot v.$$

The sin $$\alpha = \frac{1}{\text{a refractive index of the colloid 204}},$$

and the v is a full width at half maximum of the beam angle θ of the luminous body 202. Because the sin α is equal to $$\frac{1}{\text{a refractive index of the colloid 204}},$$

the value of the sin α is varied depending on the material adopted for the colloid 204. In the present embodiment, the α is an angle of total reflection of the colloid 204 in the air, and the v is a full width at half maximum of the beam angle θ of the luminous body 202.

Accordingly, as shown in FIG. 4, the present embodiment designs the range of the distance d from the light-emitting surface 220 of the luminous body 202 to the light-emitting surface of the light-emitting diode device 200 by using the properties of the angle of total reflection of the colloid 204 and the beam angle θ provided by the luminous body 202, so that light 218 longitudinally (along a width direction of the luminous body 202) emitted from the luminous body 202 can be directly extracted from the surface 206 of the colloid 204 of the light-emitting diode device 200 without colliding with a s sidewall 222 of the colloid 204. Therefore, the light utilization efficiency of the luminous body 202 is greatly enhanced, thereby increasing the brightness of the light-emitting diode device 200.

Furthermore, it is unnecessary for the light-emitting diode device 200 to additionally set a plastic case on an outer side of the colloid 204 to reflect the longitudinal light 218 of the luminous body 202, and the light utilization efficiency of the luminous body 202 can be enhanced. Therefore, the process is simplified, the material cost is decreased, and the yellowing of the light-emitting diode device 200 is effectively prevented.

In one exemplary embodiment, in the light-emitting diode device 200, the distance d from the light-emitting surface 220 of the luminous body 202 to the light-emitting surface of the light-emitting diode device 200, i.e. the surface 206 of the colloid 204, has to satisfy not only the relation the second value Z2<the distance d<the first value Z1, but also the relation the distance d>a third value Z3>a fourth value Z4, wherein:

$$\text{the third } Z3 > \frac{\text{the length } X - \text{the length } X_c}{2} \cdot \cot \alpha, \text{ and}$$

$$\text{the fourth } Z4 > \frac{\text{the length } X - \text{the length } X_c}{2} \cdot \cot v.$$

As shown in FIG. 5, the present embodiment designs the range of the distance d from the light-emitting surface 220 of the luminous body 202 to the light-emitting surface of the light-emitting diode device 200 by using the properties of the angle of total reflection of the colloid 204 and the beam angle θ provided by the luminous body 202, so that light 218 transversely emitted from the luminous body 202 can firstly collide with the sidewall 222 of the colloid 204, and then can be extracted from the side surface 210 of the colloid 204 of the light-emitting diode device 200 after being refracted by the colloid 204. Therefore, the beam angle of the light-emitting diode device 200 in a direction along the length X is increased.

Therefore, when the light-emitting diode device 200 is applied to a light source module having a light guide plate, the beam angle in the direction along the length X is increased, so that one or more dark regions on a light-entering side of the light guide plate of the light source module are prevented.

Figure 6:
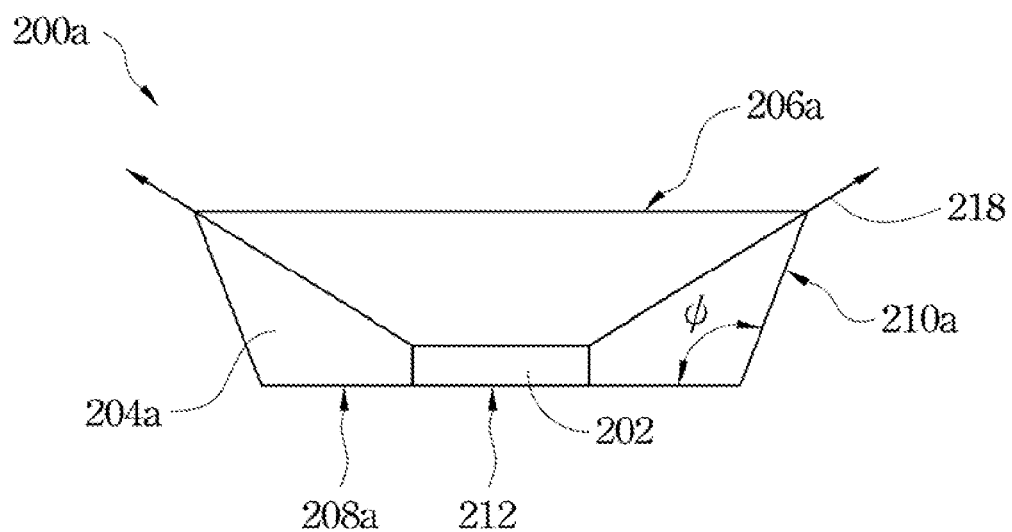
FIG. 6 illustrates a cross-sectional view of a light-emitting diode device in accordance with another embodiment of the present invention.

The light-emitting surface and the bottom surface of the colloid of the present invention may be different in area and shape. Refer to FIG. 6. FIG. 6 illustrates a cross-sectional view of a light-emitting diode device in accordance with another embodiment of the present invention. A structure of a light-emitting diode device 200a of the present embodiment is approximately the same as that of the light-emitting diode device 200 of the abovementioned embodiment, and a main difference between the light-emitting diode devices 200a and 200 is that areas of a surfaces 206a and 208a of a colloid 204a of the light-emitting diode device 200a are different.

In the light-emitting diode device 200a, both the surfaces 206a and 208a of the colloid 204a may be rectangular for example, but an area of the surface 206a is greater than that of the surface 208a. In one exemplary embodiment, a bottom surface of a luminous body 202 or an orthographic projection of the bottom surface 212 relative to the surface 208a of the colloid 204a may be located right in the center of the surface 208a. However, in another exemplary embodiment, the bottom surface 212 of the luminous body 202 or an orthographic projection of the bottom surface 212 relative to the surface 208a of the colloid 204a may not be located in the right center of the surface 208a. In the present embodiment, an orthographic projection of the luminous body 202 relative to the surface 206a of the colloid 204a is located right in the center of the surface 206a.

Furthermore, in the light-emitting diode device 200a, a side surface 210a of the colloid 204a connecting the two surfaces 206a and 208a may be not perpendicular to the surface 206a and/or the surface 208a. In one exemplary embodiment, there is an included angle φ between the side surface 210a and the surface 208a of the colloid 204a, and the included angle φ may range from 30 degrees to 150 degrees, for example.

According to the aforementioned embodiments, one advantage of the present invention is that the present invention designs a distance between a light-emitting surface of a luminous body of a light-emitting diode device and a light-emitting surface of the light-emitting diode device and a width of the luminous body to make light emitted by the luminous body be directly extracted from an opening of the colloid without colliding with a sidewall of the colloid. Therefore, the light utilization efficiency of the luminous body is enhanced.

According to the aforementioned embodiments, another advantage of the present invention is that the present invention designs a distance between a light-emitting surface of a luminous body and a light-emitting surface of a light-emitting diode device and a length of the luminous body to make light transversely emitted from the luminous body be extracted after being refracted by a sidewall of a colloid. Therefore, the beam angle of the light-emitting diode device in a length direction is increased.

According to the aforementioned embodiments, still another advantage of the present invention is that it is unnecessary for a light-emitting diode device of the present invention to include a polycarbonate plastic case to cover a colloid, so that the process is simplified, the material cost is decreased, and the yellowing of the light-emitting diode device is effectively prevented.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode device, including:
   a luminous body has a light-emitting surface and a bottom surface on opposite sides, wherein the luminous body has a first length, a first width and a beam angle; and
   a colloid covering the luminous body, wherein the colloid includes a first surface and a second surface on opposite sides, the second surface has a second length and a second width, and the colloid has a refractive index,
   wherein a distance from the light-emitting surface of the luminous body to the second surface of the colloid is smaller than a first value and greater than a second value, $$\text{the first value} < \frac{\text{the second width} - \text{the first width}}{2} \cdot \cot \alpha, \text{ and}$$

$$\text{the second value} < \frac{\text{the second width} - \text{the first width}}{2} \cdot \cot v.$$

wherein the sin α=1/the refractive index of the colloid, and the ν is a full width at half maximum of the beam angle.

2. The light-emitting diode device according to claim 1, wherein a material of the colloid is PMMA.

3. The light-emitting diode device according to claim 1, wherein the refractive index of the colloid ranges from 1.2 to 1.6.

4. The light-emitting diode device according to claim 1, wherein the beam angle ranges from 90 degrees to 160 degrees.

5. The light-emitting diode device according to claim 1, wherein the distance is greater than a third value, and the third value is greater than a fourth value, wherein:

$$\text{the third } Z3 > \frac{\text{the second length} - \text{the first length}}{2} \cdot \cot \alpha, \text{ and}$$

$$\text{the fourth } Z4 > \frac{\text{the second length} - \text{the first length}}{2} \cdot \cot \nu.$$

6. The light-emitting diode device according to claim 1, wherein the luminous body includes:
a light-emitting diode chip; and
a colloid layer covering the light-emitting diode chip.

7. The light-emitting diode device according to claim 6, wherein the colloid layer includes a fluorescent colloid.

8. The light-emitting diode device according to claim 1, wherein the first surface and the second surface are uniform in area and shape, the first surface is directly opposite to the second surface, and the bottom surface of the luminous body or an orthographic projection of the bottom surface relative to the first surface is located right in a center of the first surface.

9. The light-emitting diode device according to claim 1, wherein an orthographic projection of the luminous body relative to the second surface is located right in a center of the second surface.

10. The light-emitting diode device according to claim 1, wherein the colloid has a side surface connected between the first surface and the second surface, and an included angle between the side surface and the first surface ranges from 30 degrees to 150 degrees.

\* \* \* \* \*